(12) United States Patent
Glatthaar et al.

(10) Patent No.: US 10,808,330 B2
(45) Date of Patent: Oct. 20, 2020

(54) PROCESS FOR METALLIZING A COMPONENT

(71) Applicant: FRAUNHOFER-GESELLSCHAFT ZUR FORDERUNG DER ANGEWANDTEN FORSCHUNG E.V., Munich (DE)

(72) Inventors: Markus Glatthaar, Horben (DE); Jonas Bartsch, Freiburg (DE); Sven Kluska, Frieburg (DE); Thibaud Hatt, Freiburg (DE); Andreas Rodofili, Freiburg (DE); Martin Hermle, Freiburg (DE)

(73) Assignee: FRAUNHOFER-GESELLSCHAFT ZUR FORDERUNG DER ANGEWANDTEN FORSCHUNG E.V. (DE)

( * ) Notice: Subject to any disclaimer, the term of this patent is extended or adjusted under 35 U.S.C. 154(b) by 0 days.

(21) Appl. No.: 16/274,928

(22) Filed: Feb. 13, 2019

(65) Prior Publication Data

US 2019/0256996 A1    Aug. 22, 2019

(30) Foreign Application Priority Data

Feb. 20, 2018    (DE) .................. 10 2018 202 513

(51) Int. Cl.
*C25D 5/02*    (2006.01)
*H01L 33/36*    (2010.01)
(Continued)

(52) U.S. Cl.
CPC ............. *C25D 5/022* (2013.01); *C25D 5/54* (2013.01); *C25D 7/12* (2013.01);
(Continued)

(58) Field of Classification Search
None
See application file for complete search history.

(56) References Cited

U.S. PATENT DOCUMENTS 6,699,396 B1 * 3/2004 Drewery ................ C25D 5/022
216/40
8,399,287 B1    3/2013 Mulligan et al.
(Continued)

FOREIGN PATENT DOCUMENTS

WO    2015/148572    10/2015

OTHER PUBLICATIONS

German Office action for Patent Application No. 10 2018 202 513.4, dated Oct. 24, 2018.
(Continued)

*Primary Examiner* — J. E. Schoenholtz
(74) *Attorney, Agent, or Firm* — Tarolli, Sundheim, Covell & Tummino LLP

(57) ABSTRACT

The present invention relates to a process for producing one or more electrical contacts on a component, comprising (a) applying one or more coatings on the component, where at least one of the coatings is a coating of an electrically conductive material, (b) applying a self-passivating metal or semiconductor and/or a dielectric material on the coated component, (c) structuring the passivating coating by laser treatment or etching, (d) contacting the structured coating with an electroplating bath, (e) etching the regions not covered with the galvanically deposited metal.

13 Claims, 1 Drawing Sheet

(51) Int. Cl.
    *H01L 31/0216* (2014.01)
    *H01L 31/0224* (2006.01)
    *H01L 31/18* (2006.01)
    *H05K 3/10* (2006.01)
    *H05K 3/00* (2006.01)
    *C25D 7/12* (2006.01)
    *C25D 5/54* (2006.01)
    *H01L 33/44* (2010.01)
    *H01L 33/62* (2010.01)
    *H01L 33/38* (2010.01)
    *H01L 31/0747* (2012.01)
    *H01L 33/42* (2010.01)

(52) U.S. Cl.
    CPC ........ *H01L 31/02167* (2013.01); *H01L 31/022475* (2013.01); *H01L 31/1884* (2013.01); *H01L 33/36* (2013.01); *H01L 33/38* (2013.01); *H01L 33/44* (2013.01); *H01L 33/62* (2013.01); *H05K 3/002* (2013.01); *H05K 3/0029* (2013.01); *H05K 3/108* (2013.01); *H01L 31/0747* (2013.01); *H01L 33/42* (2013.01); *H01L 2933/0016* (2013.01); *H01L 2933/0025* (2013.01); *H01L 2933/0066* (2013.01); *H05K 2203/0315* (2013.01); *H05K 2203/0723* (2013.01)

(56) References Cited

U.S. PATENT DOCUMENTS

| | | | |
|---|---|---|---|
| 2008/0128019 A1* | 6/2008 | Lopatin | C25D 5/022 136/252 |
| 2010/0029077 A1* | 2/2010 | Barr | C25D 5/022 438/652 |
| 2014/0295614 A1 | 10/2014 | Lee et al. | |
| 2015/0311161 A1* | 10/2015 | Arvin | H01L 23/53238 257/751 |
| 2016/0240699 A1 | 8/2016 | Kamp et al. | |
| 2016/0329443 A1* | 11/2016 | Wang | H01L 31/1884 |

OTHER PUBLICATIONS

Wolf, et al., "High-efficiency Silicon Heterojunction Solar Cells: A Review", Green, vol. 2 (2012), pp. 7-24.

Rohit, et al., "Selective Plating Concept for Silicon Heterojunction Solar Cell Metallization", 124, 2017, pp. 901-906.

Glatthaar, et al., "Novel Plating Processes for Silicon Heterojunction Solar Cell Metallization using a Structured Seed Layer", IEEE Journal of Photovoltaics, vol. 7, No. 6, Nov. 2017.

* cited by examiner

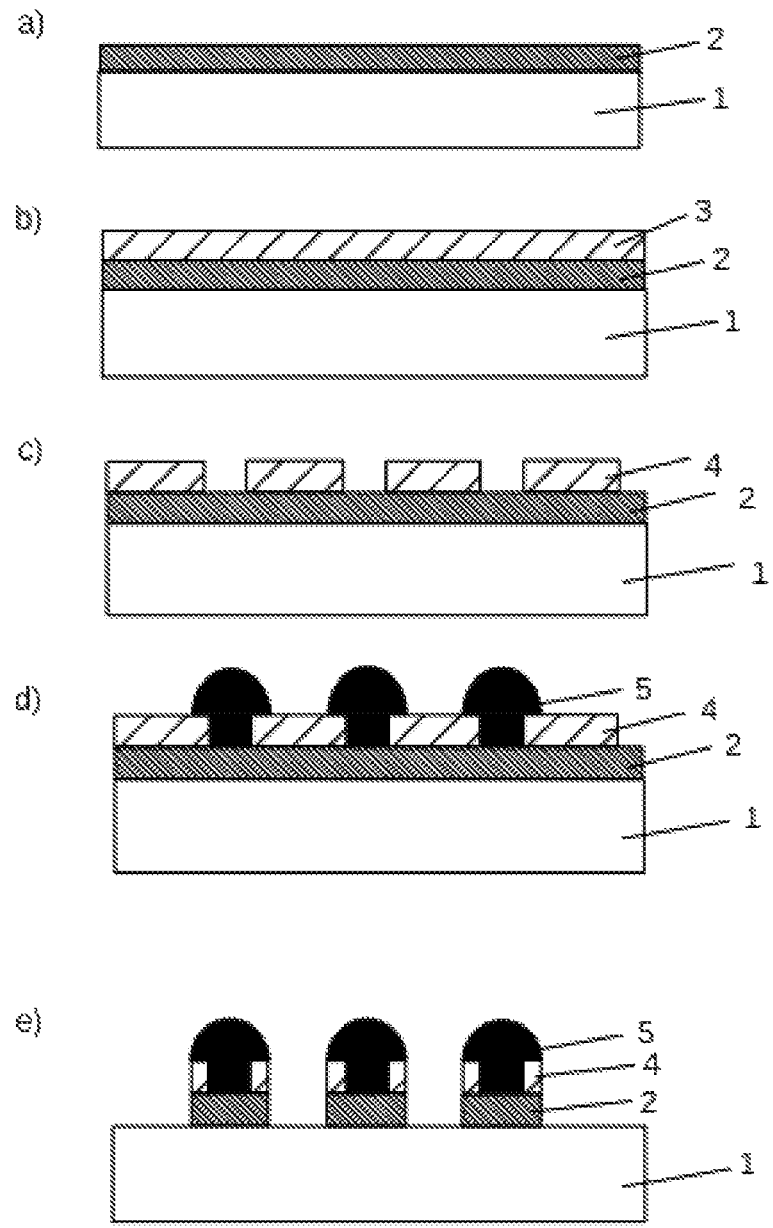
Figures 1a-e

PROCESS FOR METALLIZING A COMPONENT

The present invention relates to a process for producing electrical contacts (for example in the form of electrical conductor tracks) on a component, especially an electrical component, for example a solar cell or a light-emitting diode, or a precursor of a printed circuit board. The present invention further relates to devices obtainable via this process.

For the use of many components, it is necessary for electrical contacts, especially in the form of electrical conductor tracks, to be mounted thereon. The electrical contacts serve, for example, to remove current from the component or to tap voltage from the component or to establish an electrical connection between electrical components present on the component. If the component is a solar cell, for example, the photocurrent generated via the photovoltaic effect in this semiconductor component can be removed by the electrical contacts. Alternatively, the component may, for example, be a precursor of a printed circuit board which is ultimately converted to a printed circuit board (PCB) by the application of conductor tracks.

In a known and customary process, a paste comprising silver particles is applied to the component and then treated at a sufficiently high temperature to bring about sintering of the silver particles. For this purpose, temperatures of at least 800° C. may be required. However, such high temperatures are unacceptable for many components.

A heterojunction solar cell, for example a silicon heterojunction solar cell (SHJ solar cell), is an example of an electrical component unsuitable for application of electrical contacts at relatively high temperatures. The SHJ solar cell is a wafer-based crystalline silicon solar cell with an emitter and a back or front surface field of amorphous silicon. The starting material used for this purpose is crystalline, especially monocrystalline, silicon that has been n- or p-doped (base doping). A very thin (about 1 to 10 nm) intrinsic (undoped) amorphous silicon layer is first applied to each side thereof. This is followed on one side by the application of a likewise very thin (about 10 to 50 nm) doped amorphous silicon layer having the opposite doping type (n- or p-type) to the base doping (amorphous emitter layer). On the other side is applied a thin (10 to 50 nm) amorphous silicon layer having the doping type corresponding to the base doping (back or front surface field). Finally, a transparent conductive oxide (TCO), for example indium tin oxide (ITO), of thickness 50-100 nm is applied. Such a TCO layer, at 25° C., typically has a sheet resistance of not more than 300Ω. The construction and mode of function of heterojunction solar cells are described, for example, by S. De Wolf et al., Green, Vol. 2 (2012), p. 7-24.

In order to avoid unwanted crystallization in the amorphous silicon layers of the SHJ solar cell, temperatures of more than 250° C. should be avoided.

For other solar cell types or other electrical components such as light-emitting diodes as well, the application of electrical contacts with minimum thermal stress is desirable.

The use of sufficiently small silver nanoparticles can lower the sintering temperature of silver pastes to below 200° C. A disadvantage here, however, is that the pastes cannot be stored since the sintering process proceeds gradually even at room temperature and that silver nanoparticles constitute a considerable safety risk. Moreover, the costs for nanoparticles are much higher than for large particles or electrolytically deposited metals.

Also known is the use of pastes containing organic binders, for example thermally crosslinking resins and silver particles in flake form. The resin forms a matrix that holds the flakes together and establishes bond strength to the outer layer of the electrical component (for example a layer of a transparent electrically conductive oxide (TCO) such as ITO). But this achieves much lower conductivity than with thermally sintered pastes. As a result, more silver is required and the shadowing of the front side of the solar cell by the conductor tracks is increased.

Alternatively, the conductor tracks can be applied electrolytically. This achieves very good electrical conductivity of the conductor tracks. But the surface has to be printed with a mask of electroplating lacquer as a negative of the conductor track pattern. After the electrolytic deposition, the lacquer has to be removed in a chemical bath. But the necessity of this lacquer mask makes this process very costly owing to the material consumption and the necessary wastewater cleaning. Moreover, the bond strength of the electrolytically applied metal layer on a TCO layer (i.e. a layer of a transparent, electrically conductive oxide such as ITO) is unsatisfactory in some cases.

In the case of particularly high-value components, a thin metal layer or a metal layer stack is first applied over the whole area of the workpiece. Atop that is applied a photoresist, for example, which is structured by photolithography in the form of a negative mask of the conductor tracks to be created. Alternatively, the negative mask is applied in already structured form (for example by means of an inkjet). The non-lacquer-coated surface is thickened with copper by electrolysis and the copper is optionally protected from oxidation by an additional silver layer. Subsequently, the lacquer is removed in a chemical bath and the metal is etched in the previously lacquer-coated regions. A corresponding metallization process is described, for example, in U.S. Pat. No. 8,399,287 B1.

US 2014/0295614 A1 describes a process for metallization of backside contact solar cells. The vapor-deposited aluminum seed layer can be activated over the whole area by a zincate step. Subsequently, a local barrier layer can be applied. After the electrolytic deposition, the barrier layer has to be removed and the activated aluminum seed layer has to be etched.

WO 2015/148572 A1 describes a process for metallization of a solar cell in which an aluminum layer is locally anodized. The anodized regions bring about the electrical separation of the metal contacts of a backside contact solar cell.

R. Rohit et al., Energy Procedia, 124 (2017), p. 901-906, describe a process for metallization of a solar cell. In this process, a self-passivating coating of titanium is first deposited on an SHJ solar cell. No structuring of the titanium layer takes place. Nickel is deposited in defined regions of this self-passivating coating. This is followed by the electrolytic deposition of copper on the nickel.

In the case of printed circuit boards (PCBs) made of plastic, for lack of thermal stability of the board material, it is not possible to print conductor tracks of sinterable metal particles. Conductor tracks made of silver flakes in a resin matrix are an option only in exceptional cases owing to the high costs, lack of conductivity and lack of suitability for soldering processes for coupling of the electrical components.

It is an object of the present invention to apply electrical contacts, for example electrical conductor tracks, on a component via a process that keeps thermal stress on the component low, avoids the use of masks (e.g. lacquer masks) and is performable with maximum efficiency.

BRIEF DESCRIPTION OF THE DRAWINGS

FIGS. 1e-e illustrated the structure obtained after the process steps for producing one or more electrical contacts on a component having a front side and a back side: (a) applying one or more coatings on the front side and/or back side of the component to obtain a coated component, where at least one of the coatings is a coating of an electrically conductive material, (FIG. 1a), (b) applying a self-passivating metal or semiconductor on the coated component to obtain a passivating coating, (FIG. 1b), (c) treating defined regions of the passivating coating with a laser or by etching to obtain a structured coating, (FIG. 1c), (d) contacting the structured coating with an electroplating bath, wherein a metal is galvanically deposited in the regions treated with the laser or the etching medium, (FIG. 1d), (e) etching the regions not covered with the galvanically deposited metal until the front side and/or back side of the component has been exposed in these regions, (FIG. 1e).

This object is achieved by a process for producing one or more electrical contacts on a component having a front side and a back side, comprising the following steps:
(a) applying one or more coatings on the front side and/or back side of the component to obtain a coated component, where at least one of the coatings is a coating of an electrically conductive material,
(b) applying a self-passivating metal or semiconductor and/or a dielectric material on the coated component to obtain a passivating coating,
(c) treating defined regions of the passivating coating with a laser or by etching to obtain a structured coating,
(d) contacting the structured coating with an electroplating bath, wherein a metal is galvanically deposited in the regions treated with the laser or the etching medium,
(e) etching the regions not covered with the galvanically deposited metal until the front side and/or back side of the component has been exposed in these regions.

As known to those skilled in the art, coatings of a self-passivating metal (also referred to as "valve metals") or a self-passivating semiconductor form a thin oxide film on their surface even at room temperature (i.e. the coating has a dielectric surface in the form of a natural oxide film). What is exploited in the context of the present invention is that the presence of this oxide film prevents or at least inhibits galvanic metal deposition on the self-passivating metal or semiconductor. Galvanic deposition of a metal is impossible or at least inhibited on a coating of a dielectric metal such as silicon oxide or aluminum oxide.

If defined regions of this passivating (i.e. self-passivating or dielectric) coating are treated with a laser or an etching medium, galvanic metal deposition is subsequently possible in the treated regions, while it is still the case for the untreated regions that galvanic deposition takes place only to a minor degree, if at all. The laser or etching treatment removes the passivating coating in the treated regions, for example, so as to form one or more openings, and the coating of the electrically conductive material in these regions is at least partly exposed. Alternatively, it is also possible, for example, that the coating of the electrically conductive material diffuses into the passivating coating in the treated regions. The partial exposure of the coating of the electrically conductive material or the diffusing of this electrically conductive coating into the passivating coating generates defined regions in which galvanic metal deposition is possible.

On completion of galvanic metal deposition, the regions that have not been covered with the galvanically deposited metal can be etched away until the front side and/or back side of the component has been exposed in these regions.

By the process of the invention, metallic contacts can be mounted on a component in an efficient manner with low thermal stress. Since the self-passivating or dielectric layer can be structured in virtually any way by a laser or etching treatment, metallic contacts are also available in any form (for example in the form of fingers and busbars or an interdigital structure). No mask is required for the structuring of the dielectric or self-passivating layer. In the subsequent galvanization step, the structured coating functions as a "mask" that enables metal deposition in defined regions.

The component is, for example, an electrical component (e.g. an optoelectronic component or a semiconductor component) or a precursor thereof.

The component on which the electrical contacts are to be mounted may also be the precursor of a printed circuit board. The precursor of the printed circuit board preferably contains a plastic (especially an electrically nonconductive plastic) which may optionally also be reinforced by fibers. The precursor of the printed circuit board may, for example, be a flexible film (e.g. a polymer film) or alternatively a rigid or stiff sheet (e.g. a polymer sheet).

A preferred electrical component is, for example, a solar cell, a diode (e.g. a light-emitting diode) or a display screen, especially a flat display screen (flat panel display), e.g. a liquid-crystal display (LCD).

In the case of a solar cell, the front side is the illuminated side of the component, i.e. the side facing the radiation source. By the process of the invention, it is possible to apply the electrical contacts, for example, on the front side or on the back side (for example in the case of an exclusively backside-contacted solar cell) or on each side of the component.

The electrical component to which the electrical contact is applied need not yet be in its final form, but typically already contains those components that are essential to its function (for example achievement of the photovoltaic effect). Alternatively, the component to which the electrical contact is applied may be a precursor of an electrical component, and the further components required for the achievement of its mode of function are added only after the application of the electrical contact.

In the context of the present invention, a solar cell is understood to mean a semiconductor component that shows a photovoltaic effect under the action of radiation energy, generally sunlight.

Preferably, the solar cell is a silicon solar cell. In a preferred embodiment, the component is a heterojunction solar cell, especially a silicon heterojunction solar cell (SHJ solar cell) or a precursor thereof. As known to those skilled in the art, an SHJ solar cell typically has a layer of a transparent, electrically conductive oxide (TCO) on its front side and/or back side.

The solar cell may also be a solar cell contacted exclusively via its back side. In these solar cells, the electrical contacts are in the form of an interdigital structure, for example.

The process of the invention is of particular interest for crystalline silicon solar cell types that have a conductive layer having a conductivity that has to be further improved by conductor tracks applied in metallic form at least on one of the two surfaces of a crystalline silicon substrate that serves as base material for the solar cell.

These include, for example, solar cell types having, on at least one side of the crystalline silicon that functions as base material, an optically transparent, electrically conductive coating that suppresses the recombination of electron-hole pairs on the correspondingly coated surface of the crystalline silicon wafer.

These especially include silicon heterojunction solar cells (SHJ) in which the passivating layers consist of amorphous silicon. Alternatively, the surface may also consist of a through-tunnelable silicon dioxide layer (which is thus likewise conductive at right angles to the layer), to which a conductive polysilicon layer, a silicon carbide layer or a conductive metal oxide, for example molybdenum oxide, tungsten oxide, nickel oxide or titanium oxide, is subsequently applied. Since the conductivity of all these layers parallel to the surface is very low, preference is given to additionally applying a high-conductivity TCO layer (e.g. an ITO layer) to the recombination-suppressing layer system. Since, however, even in the case of application of a TCO layer, conductivity parallel to the surface is too low to be able to efficiently remove the current, metallic conductor tracks additionally have to be applied to the surface.

The process of the invention is of excellent suitability for solar cells as component, especially for the abovementioned solar cell types, for example an SHJ solar cell, since it does not need a high-temperature step for sintering of the metal layers applied and it is possible to dispense with organic masks.

SHJ solar cells are commercially available or can be produced via methods known to those skilled in the art.

As already set out above, in step (a), one or more coatings are applied on the front side and/or back side of the component, at least one of the coatings being a coating of an electrically conductive material. A coated component is obtained. As described in more detail hereinafter, the coating of the electrically conductive material is at least partly exposed again in defined regions in the structuring of the passivating layer effected later in step (c), or diffuses into the passivating layer in these regions, and thus enables controlled, locally limited electrolytic metal deposition.

Preferably, the electrically conductive material of the coating in step (a) is a metal (either in elemental form or in the form of an alloy). The metal may have a standard potential $E_0$ in the electrochemical potential series of $>-1.0$ V, more preferably $>-0.95$ V. The metal is, for example, copper, nickel, indium, tin, zinc, chromium, iron, cobalt or a noble metal such as silver or an alloy of one of these metals (e.g. a nickel-vanadium alloy). Further metals can be applied very efficiently atop these metals via electrolytic deposition.

Preferably, the coating of the electrically conductive material (especially a metal) is applied via a gas phase deposition, especially a physical gas phase deposition (for example by sputtering).

The coating of the electrically conductive material preferably has a thickness in the range from 10 nm to 150 nm. The coating of the electrically conductive material may have one or more layers. If it has more than one layer, it contains, for example, two or more layers each formed from an electrically conductive material.

If, in addition to the coating of the electrically conductive material, further layers are applied in step (a), these are preferably likewise metallic layers. With regard to suitable metals, reference may be made to the metals already mentioned above. However, it is also possible to use self-passivating metals such as aluminum or titanium. If further layers are applied in step (a), this can likewise be effected, for example, by a gas phase deposition (especially a physical gas phase deposition such as sputtering).

If, in step (a), further coatings are applied in addition to the coating of the electrically conductive material, the thickness of each of these further coatings is preferably in the range from 10 nm to 150 nm. The total thickness of the coatings applied in step (a) is, for example, $\leq 1$ μm, more preferably $\leq 0.6$ μm, even more preferably $\leq 0.3$ μm.

If multiple layers are applied in step (a), the coating of the electrically conductive material is preferably the uppermost layer of the coated component (i.e. the coating of the electrically conductive material is applied last).

Alternatively, it is also possible that, in step (a), a coating of a material which is thermally evaporable (especially by laser treatment) is applied to the coating of the electrically conductive material and this evaporable coating is then the uppermost layer of the coated component produced in step (a). In the later treatment of the passivating coating with a laser in step (c), the detachment of this passivating coating in the treated regions is assisted by evaporation of the evaporable material. The laser treatment also heats the coating present beneath the passivating coating. If this coating contains a material of sufficient volatility, this evaporates and supports the removal of the passivating coating above it. A material having sufficiently high evaporability in a laser treatment may, for example, be magnesium fluoride, magnesium oxide, bismuth oxide, magnesium, tin, or a mixture of at least two of these materials. The coating evaporable by laser treatment is applied by sputtering, for example.

In step (b) of the process of the invention, a self-passivating metal or semiconductor and/or a dielectric material is applied atop the coated component to obtain a passivating coating.

When using a self-passivating metal or semiconductor, the passivating coating is also referred to hereinafter as self-passivating coating. When using a dielectric material such as silicon oxide or aluminum oxide, the passivating coating is also referred to hereinafter as dielectric coating.

As known to the person skilled in the art, self-passivating metals or semiconductors are those metals or semiconductors that can spontaneously form a passivating, very thin oxide layer under air at room temperature (25° C.). The self-passivating metal is, for example, a metal which has a standard potential $E_0$ in the electrochemical potential series of $<0$ V, preferably $<-0.5$ V (thus, copper can be deposited efficiently without the risk of reducing the passivating oxide layer), more preferably $<-0.8$ (thus, water splitting is more likely to occur than reduction of the oxide layer) and which can form an oxide having a bandgap $\geq 3.0$ eV. If the standard potential $E_0 < -0.5$ V, copper can be deposited efficiently without the risk of reducing the passivating oxide layer. If the standard potential $E_0 < -0.8$ V, water splitting is more likely to occur than reduction of the passivating oxide layer. Preferably, the self-passivating metal is aluminum, titanium, tantalum or niobium or an alloy of one of these metals. More preferably, the self-passivating metal is aluminum or titanium or an alloy of one of these metals. A preferred self-passivating semiconductor is silicon.

Suitable dielectric materials for the formation of a dielectric coating are known to those skilled in the art. The dielectric material is, for example, an oxide, a nitride or an oxynitride of a metal or semiconductor. Mention may be made by way of example of silicon oxide, aluminum oxide or silicon nitride.

The passivating coating can be applied via known methods, for example by a physical gas phase deposition (e.g. sputtering, also referred to as cathode atomization), chemical gas phase deposition (e.g. plasma-assisted gas phase deposition PECVD) by applying a film of the self-passivating metal or semiconductor. These coating methods lead only to low thermal stress on the component.

The passivating coating may have, for example, a thickness in the region of ≤10 μm, more preferably ≤1 μm, even more preferably ≤300 nm or even ≤150 nm. Preferably, the passivating coating has a thickness of at least 10 nm.

The passivating layer may have one or more layers. For example, a first dielectric material (or a first self-passivating metal) may be deposited first, followed by the deposition of at least one further dielectric material (or a second self-passivating metal). Alternatively, for example, it is possible first to apply a dielectric coating and then a self-passivating coating, or first a self-passivating coating and then a dielectric coating, which then form a multilayer passivating coating.

In step (c) of the process of the invention, defined regions of the passivating coating are treated with a laser or by etching to obtain a structured coating.

The structured coating thus has treated and untreated regions. In the untreated regions, there is still the self-passivating and/or dielectric material applied in step (b).

The laser or etching treatment removes the passivating coating in the treated regions, for example, so as to form one or more openings, and the coating of the electrically conductive material applied in step (a) is at least partly exposed in these regions.

Preferably less than 20% or even less than 10% of the area of the passivating coating is removed. The openings may be in the form, for example, of linear trenches that optionally cross. The openings define, for example, the fingers and busbars on the front side and/or back side of the solar cell.

Alternatively, it is also possible, for example, that the coating of the electrically conductive material diffuses into the passivating coating in the regions that have been treated (for example by laser).

The exposure of the coating of the electrically conductive material applied in step (a) or the diffusing of this electrically conductive material into the passivating coating generates defined regions amenable to galvanic metal deposition. It is still the case for the untreated regions that galvanic deposition is possible only to a minor degree, if at all.

Suitable lasers and process conditions for the structuring of a dielectric or self-passivating coating can be determined by the person skilled in the art in routine tests. Via the power of the laser and/or the duration of the laser treatment, it is possible to determine whether the self-passivating or dielectric material is at least partly removed (which at least partly exposes the coating of the electrically conductive material applied in step (a)) or the electrically conductive material of the coating diffuses into the passivating coating in the treated regions.

The etching can be conducted, for example, using an etching mask. However, the etching is preferably effected without using a mask. In a preferred embodiment, the etching is effected by applying an etchant (e.g. an etchant in paste form) via a printing method, for example flexographic printing, screenprinting, extrusion printing or inkjet printing. The etching removes the passivating coating, and the coating of the electrically conductive material applied in step (a) is at least partly exposed.

The etching may, for example, be an electrochemical etching operation. The etching process here is influenced by application of a potential. Electrochemical etching is known to the person skilled in the art. In order to etch defined regions, the etching medium may be applied via a printing method (e.g. screenprinting or extrusion printing) for example. Etching of defined areas via an electrochemical etching method using printing methods is described, for example, in US 2016/0240699 A1.

Particular preference is given to the use of an electrochemical printing method for the etching. In this case, the printing tool is supplied with a cathodic potential, while the component is supplied with an anodic potential. A current then flows through the print medium from the metal surface of the component to the printing tool. When a suitable print medium is used, this results in local etching of the self-passivating and dielectric layers even during the printing process in the regions in which these are covered by the print medium. Particularly preferred printing methods are screenprinting and extrusion printing (dispensing). In the case of screenprinting, the component is connected to the anode contact, while the metallic screen mesh is connected to the cathode contact. In the case of dispensing, the printhead is connected to the cathode contact. Suitable print media may contain gelated phosphoric acid, for example.

As already set out above, in step (d) of the process of the invention, the structured coating obtained in step (c) is contacted with an electroplating bath. In this case, a metal is galvanically deposited in the regions treated with the laser or the etching medium, while galvanic deposition of a metal proceeds only partially, if at all, in the untreated regions. The untreated regions are thus at least partly not covered with the galvanically deposited metal.

The electroplating bath contains a salt of the metal to be galvanically deposited. An auxiliary electrode is typically also immersed into the electroplating bath, for example a copper anode ("sacrificial anode") or a titanium electrode. The structured coating functions as the counterelectrode. If a suitable negative (i.e. cathodic) electrical potential is applied to the structured coating, the metal ions are reduced and the metal is deposited in the regions treated with the laser or by etching.

The galvanic deposition can be effected by means of DC current or by means of pulsed current. The use of a pulsed current of changing sign can further improve the selective deposition of the metal in the treated regions. A pulsed current of changing sign has alternating negative (cathodic) and positive (anodic) current pulses.

The galvanically deposited metal is preferably copper or a copper alloy, nickel or a nickel alloy or a precious metal such as silver or a silver alloy.

If, in step (c), the laser or etching treatment at least partly removed the passivating coating, so as to form one or more openings, and the coating of the electrically conductive material that was applied in step (a) was at least partly exposed in these regions, the metal is galvanically deposited in step (d) in the openings. Preferably, the galvanic metal deposition is effected at least until the openings have been completely filled with the galvanically deposited metal.

In a preferred embodiment, the galvanic metal deposition is effected until the galvanically deposited metal completely fills the openings and forms an excess (i.e. some of the galvanically deposited metal projects out of the openings). This can be advantageous for the later etching in step (e). If, in the later etching step (e), the metal galvanically deposited in step (d) is also attacked by the etching medium, this galvanically deposited metal is present in a sufficient amount or thickness, such that, after the etching step (e) has ended, there is sufficient galvanically deposited metal present.

Optionally, after the galvanic metal deposition step (d) and before the etching step (e), one or more additional metals are galvanically deposited. The galvanic deposition of a further metal is in each case effected selectively atop the metal galvanically deposited beforehand. These additionally deposited metals are, for example, copper or a copper alloy, nickel or a nickel alloy or a precious metal such as silver or a silver alloy. Superposed metals (i.e. those in direct contact) are preferably different metals.

The galvanically deposited metal is present, for example, in a thickness of 1 µm to 30 µm, more preferably 3 µm to 25 µm.

In step (e) of the process of the invention, the regions not covered with the galvanically deposited metal are etched until the front side and/or back side of the component is exposed in these regions.

In the case of a printed circuit board (or the precursor of a printed circuit board), this exposed front side and/or back side is a plastic surface for example. If the component is an SHJ solar cell, this exposed front side and/or back side is, for example, a layer of a transparent, electrically conductive oxide (i.e. a "TCO" layer), e.g. an ITO layer.

Suitable etchants for the removal of the self-passivating and/or dielectric coating or the coatings applied in step (a) (e.g. the coating of the electrically conductive material) are known to those skilled in the art.

After the etching step (e) has ended, the metal galvanically deposited in step (d) is still at least partly present and can function as electrical contact (in order, for example, to remove the current generated in the solar cell).

Optionally, the etchants can be changed in the course of step (e) in order to be able to remove the respective material with maximum selectivity. The etchant may be a liquid or gaseous etchant.

If an etchant used in step (e) also attacks a metal deposited galvanically in step (d), this can be compensated for, for example, in that the thickness of the galvanically deposited metal is sufficiently high. This can ensure that, after the etching step (e) has ended, the metal deposited galvanically in step (d) is still at least partly present.

Illustrative etchants are, for example, aqueous NaOH, aqueous $NH_4OH$—$H_2O_2$ solution or phosphoric acid. Depending on the materials to be etched, it is alternatively possible to use other etchants known to the person skilled in the art.

The present invention also relates to a metallized component obtainable by the process described above.

The present invention is described in detail with reference to the illustrative embodiment which follows. The structures obtained after the respective process steps are also shown in FIGS. 1a-e.

As component 1 on which one or more electrical contacts are to be mounted, a silicon heterojunction solar cell (SHJ) is provided. This has, on its front side and on its back side, a coating of a transparent, electrically conductive oxide ("TCO"), for example indium tin oxide ("ITO") (not shown in FIG. 1a).

In step (a), a coating 2 of an electrically conductive material is applied by sputtering on the front side (or alternatively on the back side or both on the front side and on the back side) of the SHJ solar cell 1. The structure obtained is shown in FIG. 1a. This electrically conductive coating may have one or more layers. For example, nickel is first applied by sputtering (layer thickness e.g. 10-30 nm), followed by the application of copper (layer thickness e.g. 50-70 nm) and finally the application of nickel (layer thickness e.g. 10-30 nm).

In step (b), by sputtering, a layer of a self-passivating metal (e.g. aluminum) with a layer thickness of about 60-80 nm is applied. Since a natural oxide layer forms at the surface of aluminum, a self-passivating coating 3 is obtained. Alternatively, a dielectric material, for example aluminum oxide, silicon oxide or silicon nitride, can be applied (preferably likewise by sputtering), which affords a dielectric coating 3. An illustrative structure which is obtained in step (b) is shown by FIG. 1b.

In step (c), an HCl-containing etching paste is applied via a printing method atop the self-passivating aluminum layer 3 in defined regions, heated to 80° C. and rinsed with water. In these etched regions, the aluminum layer 3 is removed and the underlying nickel layer 2 is exposed. A structured coating 4 is obtained, in which the aluminum layer 3 deposited in step (b) is interrupted by one or more openings. An illustrative structure which is obtained in step (c) is shown by FIG. 1c.

In step (d), the structured aluminum layer 4 is contacted with a copper salt-containing electroplating bath. For the galvanic deposition, a pulsed current (i.e. alternating cathodic and anodic pulses) is used. The alternation of deposition pulses (i.e. cathodic pulses) and dissolution pulses (i.e. anodic pulses) of the electrical current results in selective galvanic deposition in the openings (i.e. the regions in which the etching exposed the nickel layer 2), while galvanic metal deposition on the surface of the self-passivating aluminum of the structured coating 4 takes place only to a very minor degree, if at all. The galvanic copper deposition is effected until the openings are completely filled with copper 5 and an excess of copper has even formed (i.e. the copper projects out of the openings). An illustrative structure which is obtained in step (d) is shown by FIG. 1d.

In step (e), the exposed regions (i.e. regions not covered with galvanically deposited copper) of the self-passivating aluminum of the structured coating 4 and the underlying regions of the coating 2 deposited in step (a) are etched away down to the SHJ solar cell 1. In these regions that have been etched away, the ITO surface of the SHJ solar cell 1 is thus exposed again. Adjacent to these regions that have been etched away, there remain layer stacks in which the coating 2 deposited by sputtering in step (a) and the copper 5 deposited galvanically in step (d) are each present. Optionally, at the edge of the galvanically deposited copper regions 5, residues of the self-passivating metal of the structured coating 4 may still be present (for example when excess copper 5, i.e. copper projecting out of the openings, covers part of the surface of the self-passivating aluminum and has therefore provided protection from the etchant in step (e)). An illustrative structure which is obtained in step (e) is shown by FIG. 1e.

The invention claimed is:

1. A process for producing one or more electrical contacts on a component having a front side and a back side, comprising the following steps:
    (a) applying one or more coatings on the front side and/or back side of the component to obtain a coated component, where at least one of the coatings is a coating of an electrically conductive material,
    (b) applying a self-passivating metal or semiconductor on the coated component to obtain a passivating coating,
    (c) treating defined regions of the passivating coating with a laser or by etching to obtain a structured coating,
    (d) contacting the structured coating with an electroplating bath, wherein a metal is galvanically deposited in the regions treated with the laser or the etching medium, (e) etching the regions not covered with the galvanically deposited metal until the front side and/or back side of the component has been exposed in these regions.

2. The process as claimed in claim 1, wherein the component is an electrical component, especially a solar cell or a precursor of a solar cell, a light-emitting diode or a precursor of a light-emitting diode, or a precursor of a printed circuit board.

3. The process as claimed in claim 2, wherein the solar cell is a heterojunction solar cell.

4. The process as claimed in claim 1, wherein the electrically conductive material of the coating in step (a) is a metal, selected from the group consisting of copper, nickel, indium, tin, zinc, chromium, iron, cobalt or a noble metal and an alloy of one of these metals.

5. The process as claimed in claim 1, wherein the coating of the electrically conductive material is the outermost of the coatings applied in step (a); or wherein another coating of thermally evaporable material, selected from the group consisting of magnesium fluoride, magnesium oxide, bismuth oxide, magnesium and tin, is applied atop the coating of the electrically conductive material and this coating is the outermost of the coatings applied in step (a).

6. The process as claimed in claim 1, wherein the coating of the electrically conductive material and, if present, the one or more optional coatings are applied in step (a) via a gas phase deposition.

7. The process as claimed in claim 1, wherein the self-passivating metal in step (b) is aluminum or titanium; and/or wherein the self-passivating semiconductor in step (b) is silicon.

8. The process as claimed in claim 1, wherein the passivating coating in step (b) is a multilayer passivating coating further comprising a dielectric coating of a dielectric material and wherein the dielectric material in step (b) is an oxide, a nitride or an oxynitride of a metal or of a semiconductor.

9. The process as claimed in claim 1, wherein the passivating coating in step (b) is applied via a gas phase deposition.

10. The process as claimed in claim 1, wherein, in step (c), the passivating coating is removed in the treated regions and the coating of the electrically conductive material that has been applied in step (a) is at least partly exposed.

11. The process as claimed in claim 1, wherein the etching in step (c) includes an application of an etchant by a printing method; and/or the etching is an electrochemical etching operation.

12. The process as claimed in claim 1, wherein the galvanic deposition of the metal in step (d) is effected by means of pulsed current with cathodic and anodic current pulses.

13. A metallized component obtainable by the process as claimed in claim 1.

* * * * *